United States Patent [19]
Davies

[11] Patent Number: 5,268,917
[45] Date of Patent: Dec. 7, 1993

[54] INJECTION LASER MODULATION

[75] Inventor: Graham T. Davies, Orpington, United Kingdom

[73] Assignee: Northern Telecom Limited, Quebec, Canada

[21] Appl. No.: 928,866

[22] Filed: Aug. 11, 1992

[30] Foreign Application Priority Data

Aug. 15, 1991 [GB] United Kingdom ............... 9117637

[51] Int. Cl.[5] .................................................. H01S 3/00
[52] U.S. Cl. .................................................. 372/38
[58] Field of Search ......................... 372/38, 44, 81

[56] References Cited

U.S. PATENT DOCUMENTS

| | | | |
|---|---|---|---|
| 4,577,320 | 3/1986 | Yoshikawa et al. | 372/38 |
| 4,733,398 | 3/1988 | Shibagaki et al. | 372/38 |
| 4,796,266 | 1/1989 | Banwell | 372/38 |
| 4,803,384 | 2/1989 | Yamane et al. | 372/38 |
| 4,833,680 | 5/1989 | Kaiser et al. | 372/38 |
| 4,995,045 | 2/1991 | Burley et al. | 372/38 |
| 4,995,105 | 2/1991 | Wechsler | 372/38 |
| 5,050,177 | 9/1991 | Ema | 372/38 |
| 5,123,024 | 6/1992 | Dowd et al. | 372/38 |
| 5,177,755 | 1/1993 | Johnson | 372/38 |

FOREIGN PATENT DOCUMENTS

| | | | |
|---|---|---|---|
| 0214081 | 12/1989 | Japan | 372/81 |
| 2066557 | 7/1981 | United Kingdom . | |

Primary Examiner—Rodney B. Bovernick
Assistant Examiner—Robert E. Wise
Attorney, Agent, or Firm—Lee, Mann, Smith, McWilliams, Sweeney & Ohlson

[57] ABSTRACT

A binary modulation laser driver in which a feedback loop employed in regulating the laser output power during the lower power output bits passes the output of a monitor photodiode through a limiting amplifier set to limit at a value just above lasing threshold, and stabilises the mean value of the limiting value output at a value intermediate its limiting output and half that value.

3 Claims, 2 Drawing Sheets

INJECTION LASER MODULATION

BACKGROUND OF THE INVENTION

This invention relates to the amplitude modulation of an injection laser with binary digital information, such modulation being produced by modulation of the drive current applied to the laser. This drive current may be considered as composed of a bias current and a modulation current, the bias current being the mean of the data 1 bit current and the data 0 bit current, and the modulation current being the current that is superimposed upon the bias current, augmenting it during data 1 bit periods to the data 1 bit value, and diminishing it during the data 0 bit period to the data 0 bit value.

Especially in the case of modulation at high bit rates, it is preferred to arrange for the drive current in data 0 bit periods to be a non-zero current not much greater than the value corresponding to the lasing threshold current. A lower drive current is undesirable because of the time delay and frequency chirp associated with attempting to drive an injection laser rapidly hard on from well beneath lasing threshold. On the other hand a significantly higher drive current would produce excessive amounts of light during such periods, thereby significantly impairing the contrast ratio between the data 1 and data 0 bits achieved with a particular value of bias current.

Having regard to the fact that the lasing threshold of an injection laser varies with temperature and with the effects of ageing, and that similar properties are also observed in respect of slope efficiency (ratio of incremental laser light output to current drive), a conventional laser driver incorporates some form of monitor photodetector, typically a photodiode, positioned to receive a proportion of the emitted laser radiation, typically that emitted from the rear facet of the laser, and the output of this monitor photodetector is then used for feedback purposes regulating the current drive.

In one method of regulation for balanced code binary modulation, a low frequency is superimposed on the amplitude of data 0 bits. The mean output of the photodetector is used to control the bias current, and then the modulation current is adjusted to provide a specific amplitude of low frequency ripple in the photodetector output. The value of this ripple in the photodetector output changes relatively abruptly in the vicinity of the lasing threshold because the slope efficiency below lasing threshold is relatively low and changes rapidly near threshold to a significantly higher value above threshold.

One drawback of this use of a ripple frequency to control the operation of the driver is that the binary data stream may, from time to time, include a spectral component at the ripple frequency. This can give rise to spurious effects if this spectral component is detected by the feedback control loop and falsely interpreted as an indication that the current drive is too great in the data 0 bit periods. Such a difficulty can sometimes be avoided by ensuring that the bit stream is such that it can not contain such a frequency component, or by using phase sensitive techniques and ensuring that the ripple is always in phase quadrature with any spectral component of the ripple frequency present in the data stream. Even in these circumstances there is still the drawback that the feedback technique has involved putting an additional frequency component upon the optical output, and this can cause problems elsewhere in the transmission system. Additionally it will be noted that the speed of response is limited by the low frequency of the imposed ripple.

An alternative class of methods of regulation in effect rely on peak detection, such as for instance is described in GB 1539624. In essence the basic peak detection method involves measuring the amplitude of peaks in photodetector output, and then adjusting the modulation depth to ensure that these peaks are not quite twice the magnitude of the mean value of the photodetector output. In this way it is ensured that the current drive of data 0 bits is not quite beneath the lasing threshold value.

A drawback of this peak detection method, particularly for high bandwidth data transmission systems, is that the photodetector output needs to be amplified by quite a large amount to provide a signal of sufficient amplitude to operate a typical peak detector. This means that the amplifier needs to be both high bandwidth and high gain, and a further disadvantage is that the system is responsive to the amplified noise contaminating the data 1 bits.

SUMMARY OF THE INVENTION

The present invention is directed to an alternative method of regulation, which is in effect a form of peak detection which, instead of operating on the data 1 bit levels, uses a limiting amplifier in operating on the data 0 bit levels.

According to the present invention there is provided a method of regulating the current applied to a binary modulated injection laser wherein a proportion of the laser emission is employed to provide a signal which is limited and then the mean of the limited signal is used to control the amplitude of the current applied to the laser during the lower laser power output bits such that the mean is maintained at a predetermined value intermediate the limiting value and half the limiting value.

The invention also provides a method of regulating the current applied to a binary modulated injection laser wherein a proportion of the laser emission is intercepted by a photodiode to provide a signal which is amplified in a limiting amplifier and then low-pass filtered to provide a control signal employed to control the amplitude of the current applied to the laser during the lower laser power output bits such that the mean level of the output of the limiting amplifier is maintained at a predetermined value intermediate the maximum value of its output and half that maximum value.

The invention further provides an injection laser driver including a first feedback control loop for regulating the laser bias current, and a second feedback control loop for regulating the amplitude of the laser modulation current, wherein the feedback control loops each derive a control loop signal from the output of a monitor photodetector positioned to receive a proportion of the laser emission, wherein in the second feedback control loop the output of the monitor photodetector is applied to a limiting amplifier whose limit level is less than the mean level applied to the limiting amplifier when the first feedback control loop is operating to regulate the mean optical power output of the laser so as to provide a stabilised mean photodetector output, wherein the output of the limiting amplifier is fed through a low-pass filter to a comparator where the filtered output is compared with a reference signal to provide an output signal from the comparator which is applied to a current driver adapted to employ the comparator output signal to regulate the amplitude of the modulation current applied to the laser.

BRIEF DESCRIPTION OF THE DRAWINGS

There follows a description of an injection laser driver and of its principles and method of operation embodying the invention in a preferred form. The description refers to the accompanying drawings in which.

DETAILED DESCRIPTION OF A PREFERRED EMBODIMENT

Figure 1:
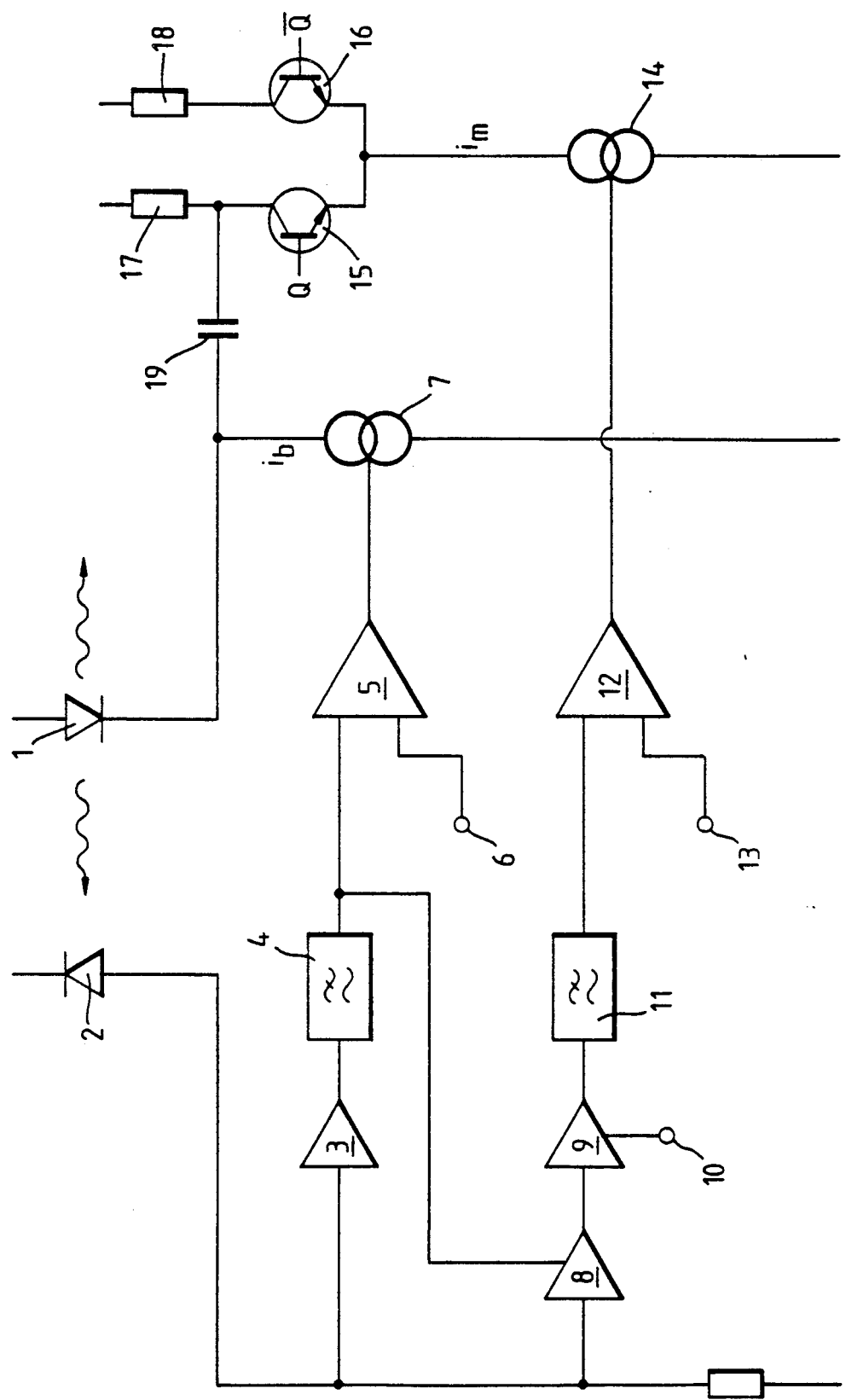
FIG. 1 is a block diagram of the driver

Referring to FIG. 1, an injection laser 1 is positioned relative to a monitor photodiode 2 so that a proportion of the light emitted from the rear facet of the laser 1 is intercepted by the photodiode. The laser driver of FIG. 1 incorporates two feedback control loops, one to regulate the laser bias current $i_b$, and the second to regulate the amplitude of the modulation current $i_m$.

In the laser bias current feedback loop, the output of the photodiode 2 is fed to an amplifier 3, whose output is passed through a low pass filter 4 to provide a signal representative of the mean level of the output of the photodiode. This mean level is compared in a differential amplifier 5 with a bias reference signal applied to an input terminal 6. The output of the differential amplifier 5 controls the magnitude of the current $i_b$ supplied by a current generator 7 to the laser 1.

In the modulation current amplitude feedback control loop, the output of the photodiode 2 is fed to an amplifier 8 whose gain is regulated by the magnitude of the mean level of the output of the low pass filter 4 of the bias current feedback control loop. The output of amplifier 8 is fed to a limiting amplifier 9 whose limit level is set by a limit reference signal applied to its input terminal 10. The output of the limiting amplifier 9 is passed through a low pass filter 11 to provide one signal input to a differential amplifier 12 to whose other signal input, at terminal 13, is applied to a modulation depth reference signal. The output of the differential amplifier 12 controls the magnitude of the current $i_m$ supplied by a current generator 14 connected in the tail of a long tailed pair formed by transistors 15 and 16 and their load resistors 17 and 18. The data Q, and its inverse $\overline{Q}$, are applied to the respective bases of the transistors 15 and 16, and the signal in transistor 15 is a.c. coupled to the laser 1 by means of a capacitor 19.

Figure 2A:
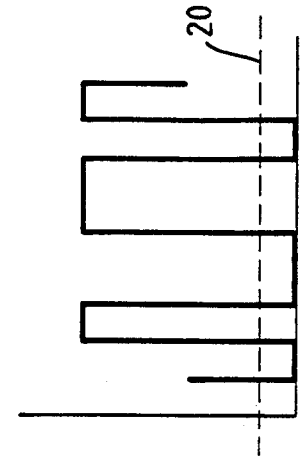
FIGS. 2a, 2b and 2c depict the power output waveform of the laser when driven with a particular data sequence, respectively with correct modulation depth, under-modulation and over-modulation.
Figure 2B:
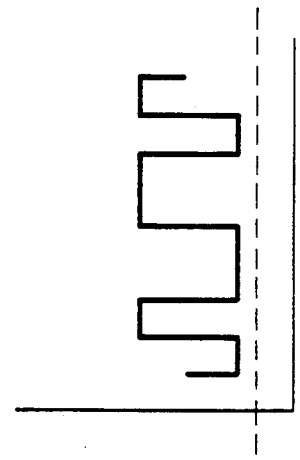
Figure 2C:
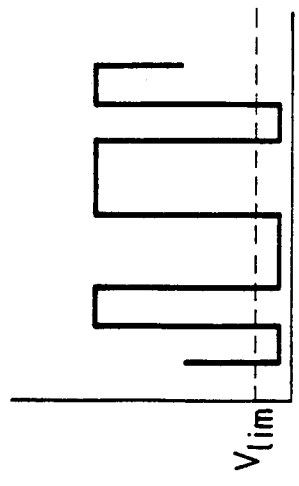

For an explanation of the principles of operation of the laser drive of FIG. 1 reference will first be made to FIGS. 2a, 2b and 2c. FIG. 2a depicts the optical power output waveform of laser 1 when driven with the data sequence 01001101 (by way of example) when the bias current feedback control loop is operating to provide the desired level of mean optical power output and the modulation depth feedback control loop is operating to give the desired modulation depth. Under these conditions the drive current during data 0 bit periods is sufficient to maintain the laser just above lasing threshold, and so, although some light is emitted at these times, it is not so great as to seriously impair the contrast ratio (defined as the ratio between the light output in data 1 bit periods to the light output in data 0 bit periods). Typically the contrast ratio might be required to be at least 10:1. FIG. 2b depicts the same waveform as FIG. 2a, but with the sole difference that the modulation depth has been significantly reduced. This represents less satisfactory operation because the contrast ratio, illustrated as about 3:1, is markedly reduced. FIG. 2c also depicts the same sequence as FIG. 2a, but in this instance the sole difference is that the modulation depth has been significantly increased, representing the situation of modulation just to the lasing threshold or modulation well below lasing threshold. For the instance where modulation to lasing threshold occurs, this has increased the contrast ratio and would be advantageous if it were not for the fact that this situation can not be differentiated from the situation of modulation to well below threshold. The instance of modulation to well below threshold implies that the laser is no longer maintained above lasing threshold during data 0 bits and hence there are attendant problems of delay, deterioration of mark-space ratio and chirp to which previous reference has been made.

Figure 3A:
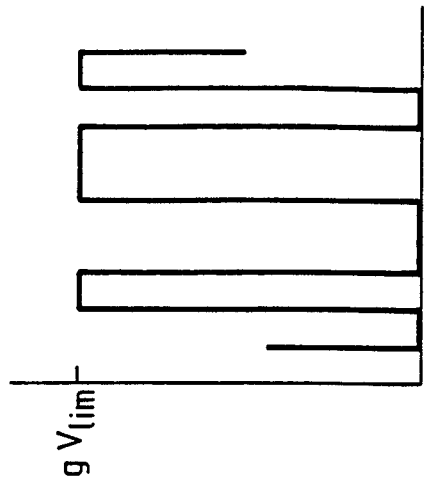
FIGS. 3a, 3b and 3c depict the waveforms of FIGS. 2a, 2b and 2c after passage through a limiting amplifier.
Figure 3B:
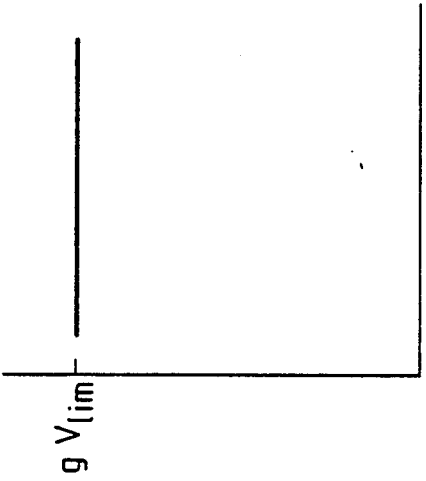
Figure 3C:
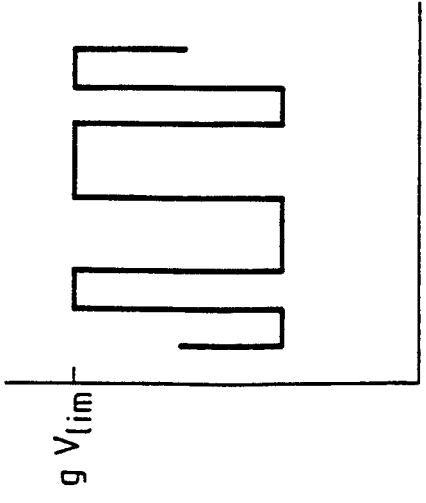

FIGS. 3a, 3b and 3c respectively depict the waveforms of FIGS. 2a, 2b and 2c after they have been fed through a limiting amplifier set to limit at an input level $V_{lim}$ represented in FIGS. 2a, 2b and 2c by the broken line 20. The corresponding output level limit is g $V_{lim}$, where g is the limiting gain of the amplifier. $V_{lim}$ is preferably equal to about twice the voltage level at the input to the limiting amplifier in data 0 bit periods when the driver is operating under optimum conditions. Under these optimum conditions the mean level of the waveform of FIG. 3a, as for instance produced by passing the waveform through a low pass filter, is about 0.75 g $V_{lim}$. The corresponding mean levels for the waveforms of 3b and 3c are g $V_{lim}$ and 0.5 g $V_{lim}$ respectively.

Reverting attention to FIG. 1, the inclusion of the variable gain amplifier 8 could have been dispensed with, but is a preferred option that enables the magnitudes of the limit reference signal applied to terminal 10, and of the modulation depth reference signal applied to terminal 13, to have preset values. The variable gain amplifier 8 serves in effect to 'normalise' the mean level of the input to the limiting amplifier 9.

Such normalisation takes account of the fact that the amount of photocurrent generated in response to a given optical output delivered by the laser 1 into the optical system in which it is operating may typically differ by as much as a factor of three between nominally identical injection laser and monitor photodiode assemblies. Such differences occur as the result for instance of differences in quantum efficiency in the photodiodes and differences in optical coupling efficiency between the lasers and their photodiodes. In consequence the bias reference signal applied to terminal 6 can not generally have a preset value, but instead needs to be adjusted to the appropriate value for the particular laser and monitor photodiode assembly with which it is operating. This appropriate value is conveniently determined by placing a photodetector (not shown) of known efficiency to collect all the optical output which would normally be delivered by the laser 1 into the system in which it is to operate, and then adjusting the level of the bias reference signal until the photodetector registers the requisite power level.

Accordingly the magnitude of the mean level of the output of the low pass filter 4 is liable to differ from driver to driver even though all drivers are delivering the same optical output power. The differences reflect the differences in coupling efficiencies between their respective lasers and photodiodes. This effect is relied upon in using the signal from the low pass filter 4 to control the magnitude of the gain provided by amplifier 8 so that the mean output of that amplifier depends upon the optical output power of the laser, but is substantially independent of its coupling efficiency with its associated monitor photodiode. Under these conditions, preset values of the magnitudes of the values of the limit reference signal applied to terminal 10, and of the modulation depth signal to terminal 13, provide a regulation of the modulation depth that sets the data 0 bit light output level to a preset proportion of the regulated mean light output level 1 provided by the laser.

I claim:

1. An injection laser driver including a first feedback control loop for regulating the laser bias current, and a second feedback control loop for regulating the amplitude of the laser modulation current, wherein the feedback control loops each derive a control loop signal from the output of a monitor photodetector positioned to receive a proportion of the laser emission, wherein in the second feedback control loop the output of the monitor photodetector is applied to a limiting amplifier whose limit level is less than the mean level applied to the limiting amplifier when the first feedback control loop is operating to regulate the mean optical power output of the laser so as to provide a stabilised mean photodetector output, wherein the output of the limiting amplifier is fed through a low-pass filter to a comparator where the filtered output is compared with a reference signal to provide an output signal from the comparator which is applied to a current driver adapted to employ the comparator output signal to regulate the amplitude of the modulation current applied to the laser.

2. A method of regulating the current applied to a binary modulated injection laser wherein a proportion of the laser emission is employed to provide a signal which is limited and then the mean of the limited signal is used to control the amplitude of the current applied to the laser during the lower laser power output bits such that the mean is maintained at a predetermined value intermediate the limiting value and half the limiting value.

3. A method of regulating the current applied to a binary modulated injection laser wherein a proportion of the laser emission is intercepted by a photodiode to provide a signal which is amplified in a limiting amplifier and then low-pass filtered to provide a control signal employed to control the amplitude of the current applied to the laser during the lower power output bits such that the mean level of the output of the limiting amplifier is maintained at a predetermined value intermediate the maximum value of its output and half that maximum value.

* * * * *